(12) United States Patent
Kakinuma et al.

(10) Patent No.: US 9,088,244 B2
(45) Date of Patent: Jul. 21, 2015

(54) FREQUENCY CONVERTER

(75) Inventors: Yuji Kakinuma, Tokyo (JP); Masato Takahashi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 128 days.

(21) Appl. No.: 14/114,373

(22) PCT Filed: Sep. 7, 2012

(86) PCT No.: PCT/JP2012/072835
§ 371 (c)(1),
(2), (4) Date: Oct. 28, 2013

(87) PCT Pub. No.: WO2013/038994
PCT Pub. Date: Mar. 21, 2013

(65) Prior Publication Data
US 2014/0057585 A1 Feb. 27, 2014

(30) Foreign Application Priority Data

Sep. 16, 2011 (JP) ................................ 2011-202508

(51) Int. Cl.
*H04B 1/26* (2006.01)
*H03D 7/00* (2006.01)
(Continued)

(52) U.S. Cl.
CPC .................. *H03D 7/00* (2013.01); *H03D 7/165* (2013.01); *H01L 43/08* (2013.01)

(58) Field of Classification Search
CPC .......... H03D 7/165; H03D 7/16; H01L 43/08; G06G 7/162; H03H 7/0184
USPC ........................... 455/323, 326, 330, 333, 325
See application file for complete search history.

(56) References Cited

U.S. PATENT DOCUMENTS 4,704,739 A * 11/1987 Murakami et al. ............ 455/325
7,808,229 B2    10/2010 Koga et al.
(Continued)

FOREIGN PATENT DOCUMENTS

JP      2009-246615    10/2009
JP      A-2010-278713  12/2010
(Continued)

OTHER PUBLICATIONS

Office Action issued in U.S. Appl. No. 14/114,365, dated Oct. 10, 2014.
(Continued)

*Primary Examiner* — Sonny Trinh
(74) *Attorney, Agent, or Firm* — Oliff PLC (57) ABSTRACT

A frequency converter includes: a plurality of mixers each including a magnetoresistance effect device including a fixed magnetic layer, a free magnetic layer, and a nonmagnetic spacer layer sandwiched between the fixed magnetic layer and the free magnetic layer, when receiving a first high-frequency signal and a local second high-frequency signal, the magnetoresistance effect device multiplying the first high-frequency signal and the local second high-frequency signal by a magnetoresistance effect to generate a multiplication signal, and a magnetic field applying unit that applies a magnetic field to the free magnetic layer. A plurality of multiplication signals generated when the first high-frequency signal and the local second high-frequency signals that differ from one mixer to another are input to the mixers, are added together and are output.

8 Claims, 3 Drawing Sheets

(51) Int. Cl.
*H03D 7/16* (2006.01)
*H01L 43/08* (2006.01)

(56) References Cited

U.S. PATENT DOCUMENTS

| | | |
|---|---|---|
| 7,825,658 B2 | 11/2010 | Koga et al. |
| 7,986,544 B2 | 7/2011 | Kent et al. |
| 7,991,377 B2 | 8/2011 | Kakinuma et al. |
| 8,019,315 B2 | 9/2011 | Kakinuma et al. |
| 8,131,249 B2 | 3/2012 | Maehara |
| 8,391,106 B2 | 3/2013 | Shimazawa et al. |
| 8,583,073 B2 | 11/2013 | Kakinuma et al. |
| 8,766,629 B2 * | 7/2014 | Maehara ............ 455/325 |
| 2008/0180085 A1 | 7/2008 | Koga et al. |
| 2009/0140733 A1 | 6/2009 | Koga et al. |
| 2009/0243698 A1 | 10/2009 | Kakinuma et al. |
| 2010/0264959 A1 | 10/2010 | Maehara |
| 2010/0301919 A1 | 12/2010 | Kakinuma et al. |
| 2011/0026156 A1 | 2/2011 | Shimazawa et al. |
| 2011/0051481 A1 | 3/2011 | Maehara |
| 2012/0025926 A1 | 2/2012 | Kakinuma et al. |
| 2013/0222092 A1 | 8/2013 | Nakada et al. |

FOREIGN PATENT DOCUMENTS

| | | |
|---|---|---|
| JP | A-2011-009551 | 1/2011 |
| JP | A-2011-181756 | 9/2011 |

OTHER PUBLICATIONS

Tulapurkar et al. "Nature." International Weekly Journal of Science, Nov. 17, 2005, vol. 438, pp. 339-342.

Susuki et al. "Microwave Properties of Spin Injection Devices." 2007, vol. 2, No. 6, pp. 282-290.

U.S. Appl. No. 14/114,365 in the name of Kakinuma et al. filed Oct. 28, 2013.

U.S. Appl. No. 14/114,383 in the name of Kakinuma et al. filed Oct. 28, 2013.

* cited by examiner

FREQUENCY CONVERTER

TECHNICAL FIELD

The present invention relates to frequency converters including mixers that generate multiplication signals by using magnetoresistance effect devices.

BACKGROUND ART

In recent years, the frequency bands allocated to radio communication have been becoming saturated. To solve this saturation problem, a dynamic allocation concept called a "radio-opportunistic" system or "cognitive communication" has been studied. This principle relies on the ability to analyze a frequency spectrum to avoid busy occupied frequency bands, identify and determine available unoccupied frequency bands, and switch a communication technique. In order to implement this dynamic frequency allocation principle, however, extremely wideband oscillators and tunable filters are needed.

Reception performance (sensitivity and selectivity) of portable terminals typically depends on frequency selectivity attenuators (band-pass filters) having low frequency selectivity and mixers. In particular, band-pass filters having high Q factors are demanded in order to use frequency bands effectively and perform radio telecommunication with low energy. Requirements for tunable filters are adjustability of center frequencies of the filters and control of expansion or narrowing of pass-bands of the filters. Existing resonators such as surface acoustic wave (SAW) filters, which are filters utilizing surface acoustic waves propagating along the surface of a piezoelectric material, and bulk acoustic wave (BAW) filters, which are filters utilizing resonant oscillation of a piezoelectric film called a BAW, cannot achieve the above-described requirements at the present time. Thus, tunable band-pass filters that are compact enough to be included in portable terminals have not been obtained yet.

A tunnel magnetoresistive (TMR) device including a spacer layer of a nonmagnetic material interposed between a fixed magnetic layer and a free magnetic layer is a known example of a magnetoresistance effect device. In a TMR device, spin-polarized electrons flow when a current flows, and the magnetic orientation (i.e., the orientation of an electron spin) of a free magnetic layer changes in accordance with the number of spin-polarized electrons accumulated in the free magnetic layer. When an attempt is made to change the magnetic orientation of a free magnetic layer that has been disposed in a certain magnetic field, torque will act so as to restore the electron spin to a stable orientation that is restricted by the magnetic field, and when the electron spin is perturbed with a specific force, oscillation called spin precession will occur.

Lately, there has been found a phenomenon (spin torque ferromagnetic resonance) in which when a high-frequency AC current flows in a magnetoresistance effect device such as a TMR device, strong resonance will occur if the frequency of the AC current flowing through the free magnetic layer matches the oscillation frequency of the spin precession that is attempting to restore the magnetic orientation (see Non Patent Literature 1). It is also known that when an RF current (i.e., an RF current with a frequency that matches the oscillation frequency (resonant frequency) of the spin precession) is injected into a magnetoresistance effect device in a state where a static magnetic field is applied to the magnetoresistance effect device from the outside and the orientation of the static magnetic field is inclined by a predetermined angle in the fixed magnetic layer relative to the magnetic orientation of the fixed magnetic layer, the magnetoresistance effect device will function so that a DC voltage that is proportional to the square of the amplitude of the injected RF current is generated across the two ends of the magnetoresistive device, or in other words, achieve a square-law detection function (or a spin torque diode effect). It is also known that an output of square-law detection from the magnetoresistance effect device is higher than an output of square-law detection from a semiconductor pn-junction diode under certain conditions (see Non Patent Literature 2).

The applicant of the present invention has focused on the square-law detection function of a magnetoresistance effect device, and has already proposed an application thereof to a mixer capable of operating at a low local power (see Patent Literature 1). A mixer of a magnetoresistance effect device includes a magnetic field applying unit that applies a magnetic field to a free magnetic layer, and when receiving a first high-frequency signal S1 and a second high-frequency signal S2 as a local signal, generates a multiplication signal S4 using magnetoresistance effect.

However, the multiplication signal S4 is significantly attenuated in a 50 Ω matching circuit. Thus, in order to make the impedance to the multiplication signal S4 higher than the impedances to the first high-frequency signal S1 and the second high-frequency signal S2, disposing an impedance circuit (a filter or a capacitor) between an input transfer line for transmitting the first high-frequency signal S1 and the second high-frequency signal S2 and the magnetoresistance effect device was proposed (see Literature 2).

Although the above-described phenomenon regarding the mixer of a magnetoresistance effect device is known, a high-frequency device capable of applying this phenomenon to an industrial use has not been discovered yet, and has been anticipated. The applicant of the present invention was able to find out that a multiplication signal output varies depending on resonance characteristics and a selective function in terms of frequency is present in the square-law detection function of a magnetoresistance effect device. However, a high Q factor could not be obtained, and a frequency selection range is considerably large. For these reasons, no industrial application has been found to date.

CITATION LIST

Non Patent Literature

NPL 1: Nature, Vol. 438, 17 Nov. 2005, pp. 339-342
NPL 2: Magune Vol. 2, No. 6, 2007, pp. 282-290
PTL 1: Japanese Unexamined Patent Application Publication No. 2009-246615
PTL 2: Japanese Unexamined Patent Application Publication No. 2010-278713

SUMMARY OF INVENTION

Technical Problem

The applicant of the present invention continued to study the above-described mixer and found that a square-law detection output (i.e., a signal level of a multiplication signal in the mixer) obtained by using magnetoresistance effect in the mixer greatly depends on the resonance characteristics of the magnetoresistance effect device. An increase in the Q factor of the resonance characteristics is expected to increase the level of the multiplication signal, and a filter performance with increased frequency selectivity has also been desired for industrial application. Finally, the applicant of the present invention has achieved a mixer having a resonance characteristic with a Q factor of 100 or more, the mixer thereby serving as a frequency selective attenuator (a band-pass filter), by applying a magnetic field in the normal direction to a free magnetic layer of a magnetoresistance effect device in order to obtain a mixer with a highly accurate band-pass filter function for reception.

Obtaining the resonance characteristics with a Q factor of 100 or more has reduced the pass-band width of the band-pass filter function for a multiplication signal, but there is still a problem in adjusting and obtaining a pass-band width within −3 dB of attenuation. Typically, the width of one channel in radio communication is increasing to about 20 MHz for obtaining an increased transmission speed (with advanced broadband techniques for spectrum distribution and other techniques). Various attempts have been made to adjust the pass-band width of the band-pass filter function for a single multiplication signal by changing the magnetic field orientation and the magnetic field intensity, but enhancement of the frequency accuracy has still been difficult.

Solution to Problem

To achieve the above-described object, a frequency converter according to the present invention includes: a plurality of mixers each including a magnetoresistance effect device including a fixed magnetic layer, a free magnetic layer, and a nonmagnetic spacer layer sandwiched between the fixed magnetic layer and the free magnetic layer, when receiving a first high-frequency signal and a local second high-frequency signal, the magnetoresistance effect device multiplying the first high-frequency signal and the local second high-frequency signal by a magnetoresistance effect to generate a multiplication signal, and a magnetic field applying unit that applies a magnetic field to the free magnetic layer, in which a plurality of multiplication signals generated when the first high-frequency signal and the local second high-frequency signals that differ from one mixer to another are input to the mixers, are added together and are output.

In the frequency converter according to the present invention, the local second high-frequency signals that differ from one mixer to another are set to have frequencies near a frequency f2 defined for a local signal.

In the frequency converter according to the present invention, the local second high-frequency signals that differ from one mixer to another are set such that, when the local second high-frequency signals are defined to each have a frequency of f2+n×Δf (where n is . . . , −2, −1, 0, 1, 2, . . . , and Δf is a frequency step size), the local second high-frequency signals are scattered at an identical frequency step size and when all the differences between the frequencies of the local second high-frequency signals and the frequency f2 are added together, ϵ(n×Δf) of a sum of all the differences approach zero.

In the frequency converter according to the present invention, a resonant frequency of the magnetoresistance effect device included in each of the mixers is near the frequency f2 of the local second high-frequency signals.

In the frequency converter according to the present invention, the resonant frequencies of the magnetoresistance effect devices of claim 4 are set such that when each of the resonant frequencies is defined to be f0+n×Δf (where n is . . . , −2, −1, 0, 1, 2, . . . and Δf is a frequency step size), the resonant frequencies are scattered at an identical frequency step size, a frequency f0 is caused to match the frequency f2 of the local second high-frequency signals, and when all the differences between the resonant frequencies and the frequency f2 are added together, Σ(n×Δf) of a sum of all the differences approach zero.

The frequency converter according to the present invention is configured such that the first high-frequency signal is divided and the divided first-frequency signals are input to the plurality of mixers.

The frequency converter according to the present invention includes a plurality of output buffers for RF semiconductor amplifiers and is configured such that the first high-frequency signal does not return to the RF amplifiers from the magnetoresistance effect device.

The frequency converter according to the present invention is configured such that when the first high-frequency signal is defined to have a frequency of f1 (f1>f2) and all the multiplication signals (with frequencies (f1+f2+n×Δf) and (f1−f2−n×Δf)) generated in the mixers are added together, Σ(n×Δf) of a sum of all the differences approach zero, (f1+f2), and (f1−f2).

DESCRIPTION OF EMBODIMENT

An embodiment of a frequency converter will be described with reference to the attached drawings.

First, configurations of a single mixer 1 and a frequency converter 100 including the mixer 1 will be described with reference to the drawings. In the following description, an example is given in which the frequency converter 100 is applied to a receiver RX.

Figure 1:
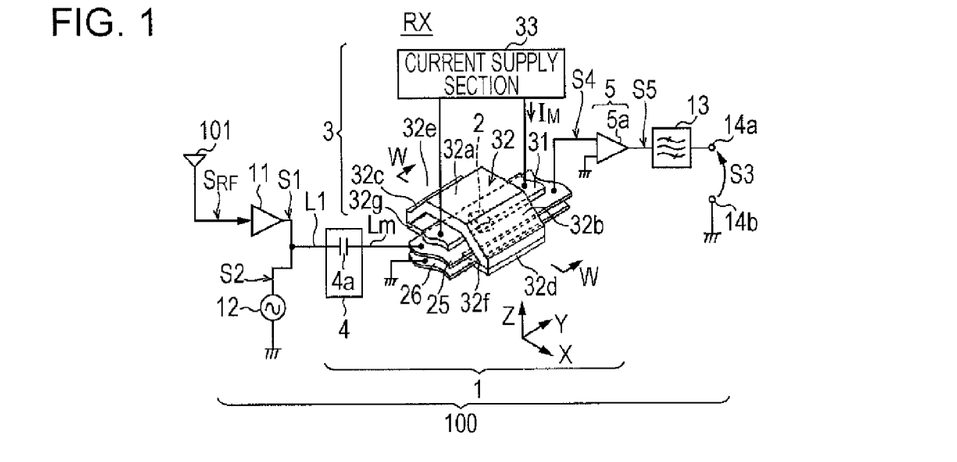
FIG. 1 illustrates a configuration of a single frequency converter 100.

The frequency converter 100 illustrated in FIG. 1 and an antenna 101 constitute the receiver RX. The frequency converter 100 is disposed in a high-frequency stage of the receiver RX that receives an RF signal $S_{RF}$ from the antenna 101, and converts a frequency f1 of the RF signal $S_{RF}$ to a desired frequency of a multiplication signal S3. The frequency converter 100 includes, for example, an amplifier 11, a signal generator 12, a filter 13, and output terminals 14a and 14b (which will be hereinafter referred to as output terminals 14 when being not specifically distinguished from each other), as well as the mixer 1. The amplifier 11 receives and amplifies the RF signal $S_{RF}$, and outputs the amplified signal as a signal S1 (a first high-frequency signal). The signal generator 12 functions as a so-called local oscillator, and generates a local signal (a second high-frequency signal) S2 with a frequency of f2. Specifically, the signal generator 12 generates and outputs, for example, a local signal S2 of −15 dBm±5 dBm. The signal S1 and the local signal S2 output in the manner described above are transferred to an impedance circuit 4 through a signal transmission line (e.g., a microstrip line, hereinafter also referred to as a "transmission line") L1 whose characteristic impedance is defined to be 50 Ω.

Figure 2:
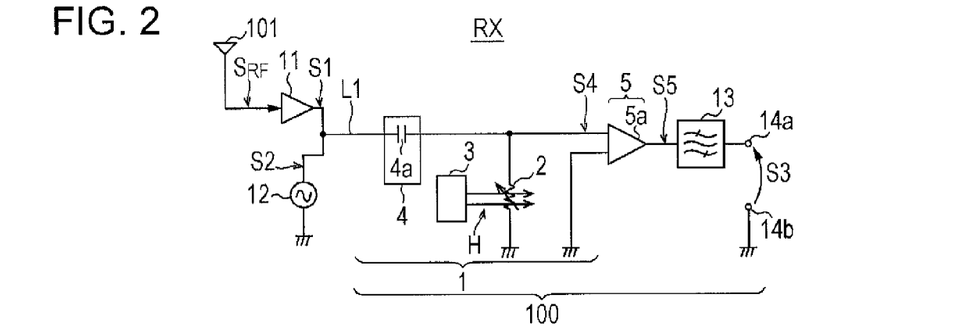
FIG. 2 is an equivalent circuit diagram of a single mixer 1.

The mixer 1 includes a magnetoresistance effect device 2, a magnetic field applying unit 3, the impedance circuit 4, and an impedance converter 5, and multiplies a signal Si (with a frequency f1) from the amplifier 11 by a local signal S2 (with a frequency f2) generated by the signal generator 12 to output an output signal S5 as a multiplication signal. In this case, the output signal S5 includes signals with the frequencies f1 and f2 and multiplication signals with frequencies (f1+f2), (f1−f2), 2×f1, 2×f2, 3×f1, 3×f2, and . . . , for example. The signal generator 12 is not essential for the frequency converter 100, and a signal from the signal generator 12 may be input together with an RF signal $S_{RF}$ to the frequency converter 100 from the outside. The mixer 1 illustrated in FIG. 1 is represented by an equivalent circuit illustrated in FIG. 2.

Figure 3:
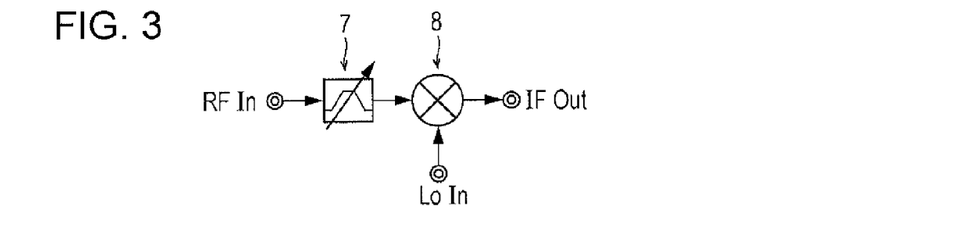
FIG. 3 is an equivalent circuit diagram illustrating the functions of a band-pass filter and a mixer included in a single magnetoresistance effect device 2 when a magnetic field H is applied to the magnetoresistance effect device 2.

FIG. 3 is an equivalent circuit diagram illustrating a band-pass filter 7 and a mixer 8 in the magnetoresistance effect device 2 in a case where a constant magnetic field H is applied to the magnetoresistance effect device 2. FIG. 3 illustrates individual terminals: a terminal RF In corresponding to an input terminal of the first high-frequency signal S1; a terminal Lo In corresponding to an input terminal of the local second high-frequency signal S2; and a terminal IF Out corresponding to an output terminal of the multiplication signal. In actual application, however, a single signal line connected to the free magnetic layer of the magnetoresistance effect device 2 serves as the three input/output terminals RF In, Lo In, and IF Out.

An attenuation curve of the band-pass filter 7 illustrated in FIG. 3 is determined using the maximum intensity and the attenuation region of resonance characteristics 6 of the magnetoresistance effect device 2 and a positional relationship among a resonant frequency f0 of the magnetoresistance effect device 2, the frequency f1 of the first high-frequency signal S1 input to the magnetoresistance effect device 2, and the frequency f2 of the local second high-frequency signal S2. The mixer 8 illustrated in FIG. 3 generates a multiplication signal by using the magnetoresistance effect device 2. This generation of a multiplication signal specifically means output of a multiplication signal whose signal level is flat in an operating frequency region. In the frequency conversion operation by the magnetoresistance effect device 2, the frequencies (f1+f2), (f1−f2), 2×f1, 2×f2, 3×f1, 3×f2, and . . . of the multiplication signal are affected by attenuation caused by the band-pass filter 7.

Figure 4:
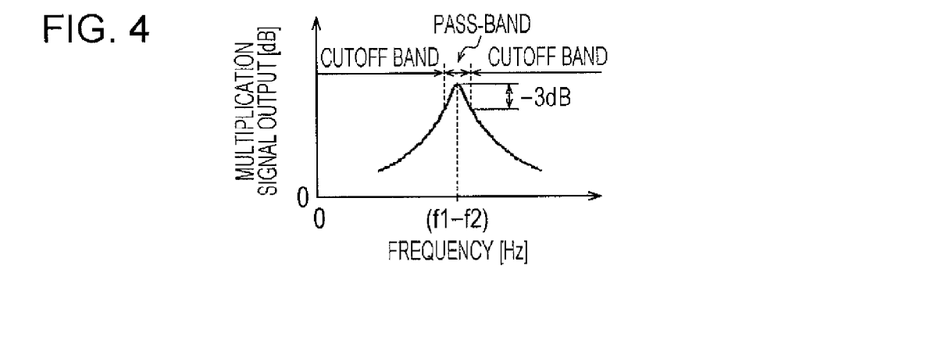
FIG. 4 is a graph that emphasizes a separation between a pass-band (with an attenuation amount of −3 dB or less) and a cutoff band of a signal spectrum of a multiplication signal (f1−f2) in a signal appearing in a voltage signal S4 (a multiplication signal) with respect to the frequency of a high-frequency signal S1 when a magnetic field H is applied to the magnetoresistance effect device 2.

FIG. 4 is a graph that emphasizes a separation between a pass-band (with an attenuation amount of −3 dB or less) and a cutoff band of a signal spectrum of a multiplication signal (f1−f2) in a signal appearing in a voltage signal S4 (a multiplication signal) with respect to the frequency of the high-frequency signal S1 in a case where an applied magnetic field H is given to a single magnetoresistance effect device 2. The graph represents that only a signal that has been allowed to pass through a pass-band with an attenuation amount of −3 dB or less at the peak of band-pass filter characteristics of the multiplication signal produced by a single mixer is used as a signal for reception and demodulation. In consideration of presence of an attenuation amount represented as a curve with an IF intermediate filter in actual application, a desirable attenuation amount is less than −3 dB. In the case of band-pass filter characteristics of a multiplication signal produced by a single mixer, a change in orientation and intensity of an applied magnetic field H can expand a pass-band, but causes a loss of steepness at both shoulders as a band-pass filter (and also causes an insufficient isolation difference between a pass signal level and a cutoff signal level), leading to a gentle characteristic curve. In addition, in the case of band-pass filter characteristics of a multiplication signal produced by a single mixer, a change in orientation and intensity of an applied magnetic field H can cause the pass-band width of the band-pass filter of the mixer to match channel widths of various communication modes, but might result in insufficient filter performance.

Next, a band-pass filter with a variable center frequency and a variable pass-band width will be described. Specifically, this band-pass filter is implemented by using a plurality of mixers 1(1, n) including parallel magnetoresistance effect devices 2 of the present invention and local-signal generators 121 to 12n so that multiplication signals from the mixers 1(1, n) are superimposed on each other, i.e., the sum of the multiplication signals is obtained and output. The configuration according to this embodiment is illustrated as a circuit diagram of FIG. 5 including parallel mixers 1(1, n), parallel frequency converters 100(1, n), and local signal generators 121 to 12n. The frequency converters 100(1, n) and an antenna 101 constitute a receiver RX together. Each of the frequency converters 100(1, n) is disposed in a high-frequency stage of the receiver RX that receives an RF signal $S_{RF}$ from the antenna 101, and converts a frequency f1 of the RF signal $S_{RF}$ to a desired frequency of a multiplication signal S3.

Figure 5:
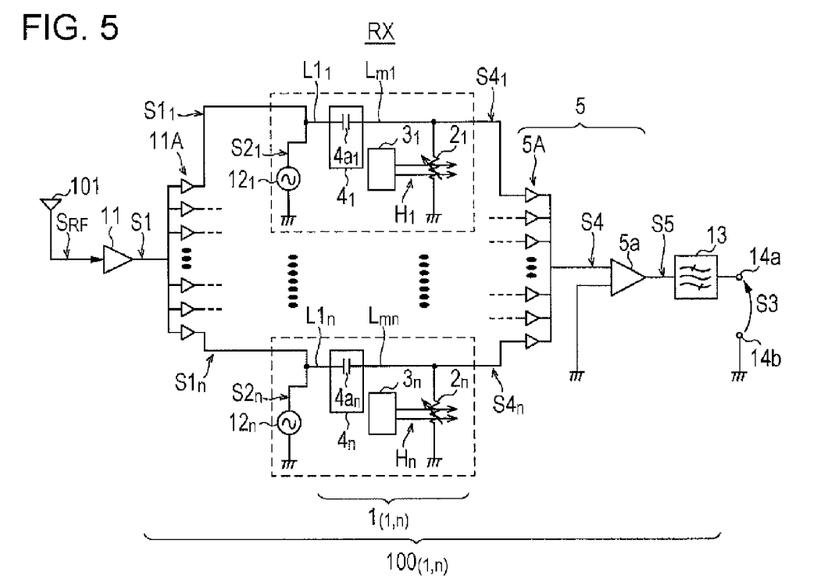
FIG. 5 illustrates a configuration of frequency converters 100(1, n) each including a plurality of parallel mixers 1(1, n) and local signal generators 121 to 12n.

Each of the frequency converters 100(1, n) includes, for example, a high-frequency (RF) amplifier 11, parallel RF amplifier output sections 11A, signal generators 121 to 12n, an intermediate-frequency (IF) amplifier 5, parallel IF amplifier output sections 11A, a filter 13, and output terminals 14a and 14b (which will be hereinafter referred to as output terminals 14 when not being specifically distinguished from each other), in addition to the parallel mixers 1(1, n). The RF amplifier 11 receives and amplifies an RF signal $S_{RF}$, and outputs the amplified signal as parallel signals S11 to S1n (first high-frequency signals). The signal generators 121 to 12n function as so-called local oscillators, and generate parallel local signals (second high-frequency signals) S21 to S2n with frequencies f21, f22, f23, . . . , and f2n near a frequency f2. For example, the signal generators 121 to 12n respectively generate and output local signals S21 to S2n of −15 dBm±5 dBm. The signals S11 to S1n and the local signals S21 to S2n output in the manner described above are transferred to impedance circuits 41 to 4n through signal transmission lines (e.g., microstrip lines, hereinafter also referred to as "transmission lines") L11 to L1n whose characteristic impedances are defined to be 50 Ω.

The mixers 1(1, n) respectively include magnetoresistance effect devices 21 to 2n, magnetic field applying units 31 to 3n, impedance circuits 41 to 4n, and multiply signals S11 to S1n (with a frequency f1) from the RF amplifier 11 and the RF amplifier output sections 11A by the local signals S21 to S2n (with the frequencies f21, f22, f23, ..., and f2n) generated by the signal generators 121 to 12n to output an output signal S5 as a multiplication signal. In this case, the output signal S5 includes signals with the frequencies f1 and f2 and the multiplication signals with frequencies (f1+f2), (f1−f2), 2×f1, 2×f2, 3×f1, 3×f2, and ..., for example. The signal generators 121 to 12n are not essential for the frequency converters 100(1, n), and signals may be input together with the RF signal $S_{RF}$ to the frequency converters 100(1, n) from the outside. The frequency converters 100(1, n) illustrated in FIG. 5 are configured as circuits obtained by extending the equivalent circuit of FIG. 2.

As will be described below, the mixers 1(1, n) cause frequencies f01, f02, f03, ..., and f0n near the resonant frequency f0 of the magnetoresistance effect devices 21 to 2n to match the frequencies f21, f22, f23, ..., and f2n near the frequency f2 of the local signals S21 to S2n. The frequency f1 of the signals S11 to S1n is generally set near the frequency f2. Thus, the impedance circuits 41 to 4n can be constituted by, for example, band-pass filters having impedance characteristics illustrated in FIG. 9. In this case, as illustrated therein, the pass-bands of the band-pass filters include the frequencies f01, f02, f03, ..., and f0n near the resonant frequency f0 of the magnetoresistance effect devices 21 to 2n (i.e., the frequencies f21, f22, f23, ..., and f2n near the frequency f2 of the local signals S21 to S2n) and the frequency f1 of the signals S11 to S1n. The frequencies of multiplication signals that are square-law detection outputs from the magnetoresistance effect devices 21 to 2n are as follows: Impedance characteristics of the magnetoresistance effect device 21 are defined such that the attenuation band thereof includes (f1+f21), (f1−f21), 2×f1, 2×f21, 3×f1, 3×f21, ..., impedance characteristics of the magnetoresistance effect device 22 are defined such that the attenuation band thereof includes (f1+f22), (f1−f22), 2×f1, 2×f22, 3×f1, 3×f22, ..., and impedance characteristics of the magnetoresistance effect device 2n are defined such that the attenuation band thereof includes (f1+f2n), (f1−f2n), 2×f1, 2×f2n, 3×f1, 3×f2n, .... The impedance circuits 4 each include, for example, a coupling capacitor, and have the function of preventing leakage, toward the RF amplifier output sections 11A or the signal generators 121 to 12n, of a DC component of a square-law detection output occurring in the magnetoresistance effect devices 21 to 2n. Each coupling capacitor includes an equivalent series inductance, and thus, functions as a simple band-pass filter.

The impedance converter 5 includes, for example, an operational amplifier 5a and parallel input sections 5A. In this example, each of the operational amplifier 5a and the parallel input sections 5A has one of its input terminals coupled to an upper electrode 25, and the other input terminal grounded, and thereby, serves as a differential amplifier. In this manner, the operational amplifier 5a and the parallel input sections 5A receive voltage signals S41 to S4n occurring across the two ends of the magnetoresistance effect devices 21 to 2n due to inputs of the signals S11 to S1n and the local signals S21 to S2n through capacitors 4a1 to 4an, amplify the voltage signal S4, and output the amplified signal as an output signal S5 to an output transmission line L2 (e.g., a microstrip line, hereinafter also referred to as a "transmission line L2"). The operational amplifier 5a typically has a considerably high input impedance, and a sufficiently low output impedance. Thus, in this configuration, the operational amplifier 5a receives the voltage signal S4 occurring across the two ends of the magnetoresistance effect device 2 with an input impedance higher than an output impedance, amplifies the input voltage signal S4 into the output signal S5, and outputs the output signal S5 with a low impedance. Thus, the operational amplifier 5a serves as an impedance converter. In this case, the operational amplifier 5a and the parallel input sections 5A output the output signal S5 with an output impedance that matches a characteristic impedance of the output transmission line L2. The filter 13 is constituted by, for example, a band-pass filter (BPF, a second filter), and is disposed on the transmission line L2 to allow only a signal with a desired frequency to pass therethrough from the output signal S5, thereby outputting the signal that has passed through the filter to the output terminal 14 as a multiplication signal S3. Specifically, the filter 13 allows a signal with a frequency (a desired frequency) of one of the frequencies (f1−f2) and (f1+f2) to pass therethrough.

Next, mixing operation of the mixers 1(1, n) and frequency conversion operation of the frequency converters 100(1, n) will be described. The following example is based on the following configuration. An RF signal $S_{RF}$ (frequency f1=4.05 GHz) received through the antenna 101 is input. The signal generator 12 generates local signals S21 to S2n (where frequency f2=4.0 GHz (<f1), and frequencies near f2 are as follows: f21=3.8 GHz, f22=3.85 GHz, f23=3.95 GHz, f24=4.0 GHz, f25=4.05 GHz, f26=4.1 GHz, f27=4.15 GHz, and f24=4.2 GHz). The capacitors 4a1 to 4an constituting the respective impedance circuits 41 to 4n are selected, and the self-resonant frequency bands (pass-bands) including their self-resonant frequency fs (=4.0 GHz) include the frequency f1 (=4.05 GHz) of the signals S11 to S1n, and the frequencies f21 (=3.8 GHz), f22 (=3.85 GHz), f23 (=3.9 GHz), f24 (=3.95 GHz), f25 (=4.0 GHz), f26 (=4.05 GHz), f27 (=4.1 GHz), f28 (=4.15 GHz), and f29 (=4.2 GHz) of the signals S21 to S2n. The capacitors 4a1 to 4an only need to have pass-bands of self-resonances in the frequency range from 3.80 GHz to 4.20 GHz. The resonance characteristics of the magnetoresistance effect devices 21 to 2n preferably have peaks at the frequencies f21 (=3.8 GHz), f22 (=3.85 GHz), f23 (=3.9 GHz), f24 (=3.95 GHz), f25 (=4.0 GHz), f26 (=4.05 GHz), f27 (=4.1 GHz), f28 (=4.15 GHz), and f29 (=4.20 GHz) of the local signals S21 to S2n. Thus, the values are defined such that the magnetic fields H1 to Hn that cause resonant frequencies f01, f02, f03, f04, f05, f06, f07, f08, and f09 to match the frequencies f21, f22, f23, f24, f25, f26, f27, f28, and f29 of the respective local signals S21 to S2n can be applied to the magnetoresistance effect devices 21 to 2n. The local signals S21 to S2n are defined to have power (e.g., −15 dBm±5 dBm) capable of supplying a current that can cause resonance in the magnetoresistance effect devices 21 to 2n. The output signal S5 from the differential amplifier section 5 through the mixing operation of the mixers 1(1, n) includes, due to the frequency component f1 of the signals S11 to S1n and the frequency components f21, f22, f23, . and f29 of signals S21 to S2n, signal components (f1, f21, f22, f23, ..., and f29) of themselves and, (f1+f21), (f1−f21), 2×f1, 2×f21, 3×f1, 3×f21, in the magnetoresistance effect device 21 as frequency components of the multiplication signals, (f1+f22), (f1−f22), 2×f1, 2×f22, 3×f1, 3×f22, ..., in the magnetoresistance effect device 22, and (f1+f29), (f1−f29), 2×f1, 2×f29, 3×f1, 3×f29, ... in the magnetoresistance effect device 29. The frequencies f21, f22, f23, ..., and f29 of these frequency components are inherently near the frequency f2, and thus, a desired frequency component (a frequency component (f1+f2) or a frequency component (f1−f2) can be allowed to pass. In this example, the filter 13 is configured, for example, such that a component (f1−f2) in a low-frequency band passes through the filter 13 and signals outside of this band do not pass through the filter 13. In this case, the filter 13 is a band-pass filter, but may be a low pass filter.

In the frequency converters 100(1, n), the local signal S2 (with the frequency f2) is input from the signal generators 121 to 12n to the mixers 1(1, n) in a state where a current supply section 33 supplies a current I (i.e., a magnetic field H is applied to the magnetoresistance effect device 2). The impedance circuit 4 (the capacitor 4a) has a sufficiently low impedance (10 Ω in this example) at the frequencies f21, f22, f23, ..., and f29 near the frequency f2 of the local signals S21 to S2n. Thus, the local signals S21 to S2n pass through the impedance circuits 41 to 4n with significantly small attenuation and are output to the magnetoresistance effect devices 21 to 2n. In this state, the frequency f2 (the frequencies f21, f22, f23, ..., and f29 near the frequency f2 in this example) of the local signals S21 to S2n matches the resonant frequency f0 (the frequencies f01, f02, f03, ..., and f09 near the frequency f2 in this example) of the magnetoresistance effect devices 21 to 2n (where f21=f01, f22=f02, f23=f03, ..., f29=f09 in this example), and power thereof allows the magnetoresistance effect devices 21 to 2n to generate resonance. Accordingly, a strong resonance (a spin torque ferromagnetic resonance) occurs in each of the magnetoresistance effect devices 21 to 2n. With this resonance, when an RF signal $S_{RF}$ (with the frequency f1) is input from the antenna 101 to the amplifier 11 and then the RF amplifier 11 and the RF amplifier output sections 11A start outputting signals S11 to S1n (with the frequency f1), the magnetoresistance effect devices 21 to 2n start square-law detection operation on two signals S11 to S1n and S21 to S2n. At this time, the impedance circuits 41 to 4n (capacitors 4a1 to 4an) have sufficiently low impedance (10 Ω or less in this example) even at the frequency f1 of the signals S11 to S1n. Thus, similarly to the local signals S21 to S2n, the signals S11 to S1n pass through the capacitors 4a1 to 4an with significantly small attenuation without being reflected, and are output to the magnetoresistance effect devices 21 to 2n.

As described above, the voltage signals S41 to S4n generated by square-law detection operation (mixing operation) of the magnetoresistance effect devices 21 to 2n are constituted by various frequency components inherently including two frequency components (f1+f2 and f1−f2), which are included in an attenuation band outside of the pass-bands of the capacitors 4a1 to 4an. Thus, the impedances of the capacitors 4a1 to 4an (i.e., impedance circuits 41 to 4n) for the frequency components (f1+f2 and f1−f2) are higher than the impedances of the capacitors 4a1 to 4an for the signals S11 to S1n (with the frequency f1) and the local signals S21 to S2n (with the frequencies f21, f22, f23, ..., and f2n near the frequency f2). In particular, the capacitors 4a1 to 4an for frequency components having a frequency (i.e., f1−f2=50 MHz) equal to that of the multiplication signal S3 output from the frequency converters 100(1, n) of this example have high impedances exceeding 1000 Ω. As described above, the operational amplifier 5a and the parallel input sections 5A constituting the impedance converter 5 coupled to the magnetoresistance effect devices 21 to 2n have significantly high input impedances (which are typically several hundred KΩ or more). Thus, since the transmission lines Lm1 to Lmn through which the voltage signals S41 to S4n are output by the magnetoresistance effect devices 2 have high impedances (exceeding 1000 Ω), the magnetoresistance effect devices 21 to 2n generate the voltage signals S41 to S4n with high levels and output the voltage signals S41 to S4n to the transmission lines Lm1 to Lmn, as described above.

Figure 6:
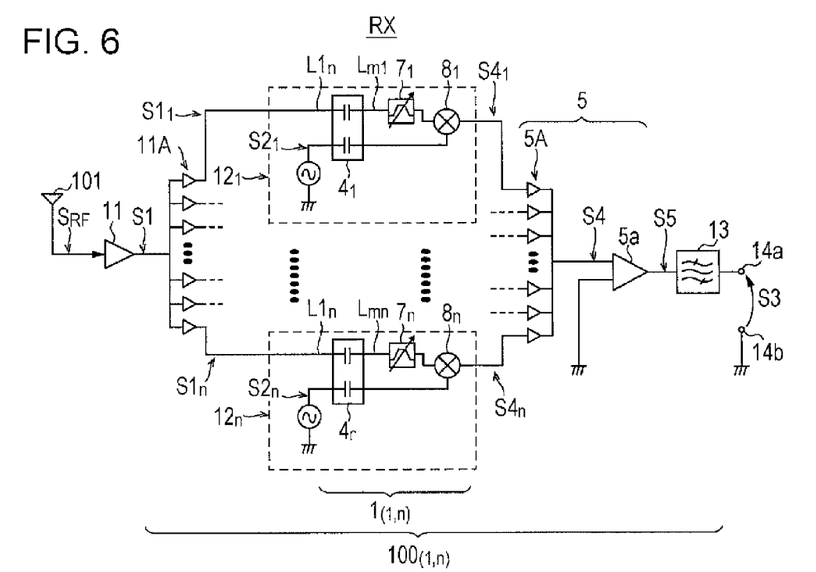
FIG. 6 is an equivalent circuit diagram illustrating a configuration of the frequency converters 100(1, n) each including a plurality of parallel band-pass filters 7(1, n), mixers 8(1, n), and local signal generators 121 to 12n.

FIG. 6 is an equivalent circuit diagram illustrating a configuration of the frequency converters 100(1, n) including a plurality of parallel band-pass filters 71 to 7n, mixers 81 to 8n, and local signal generators 121 to 12n. FIG. 6 illustrates the band-pass filters 71 to 7n and the mixers 81 to 8n included in the magnetoresistance effect devices 2, and illustrates the impedance circuit 4 (the capacitor 4a) in such a manner that the impedance circuit 4 is constituted by two components, for convenience. However, the impedance circuit 4 is actually constituted by one component. The illustration means that the impedance circuit 4 is coupled to an RF In signal line corresponding to inputs of the first high-frequency signals S11 to Sin, i.e., the band-pass filters 71 to 7n, and to an Lo In signal line corresponding to inputs of the local second high-frequency signals S21 to S2n, i.e., the mixers 81 to 8n, and an IF Out signal line corresponding to outputs of the multiplication signals of the mixers 81 to 8n is coupled to a circuit in a subsequent stage. In an actual magnetoresistance effect device 2, however, a single signal line serves as the three input/output terminals RF In, Lo In, and IF Out connected to the free magnetic layer.

Figure 7:
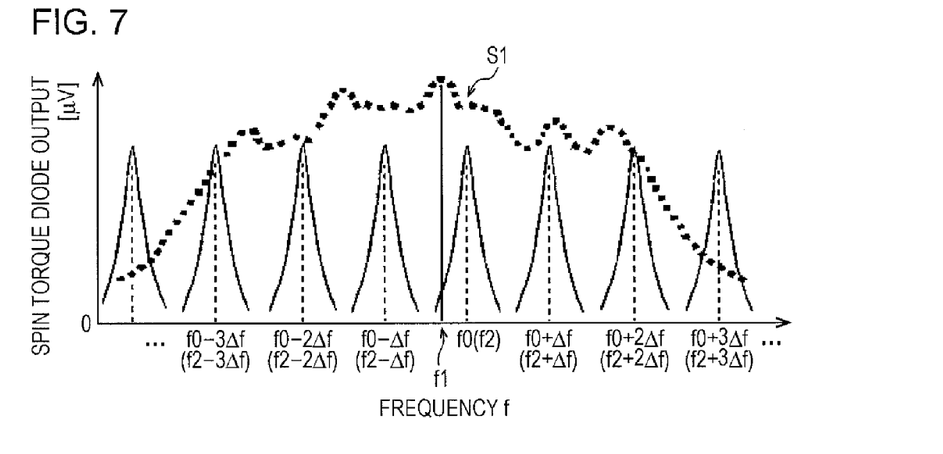
FIG. 7 is a frequency distribution spectral diagram illustrating a positional relationship between a signal spectrum of a high-frequency signal S1 and spin torque resonances obtained by including the parallel mixers 1(1, n) and the local signal generators 121 to 12n.

FIG. 7 is a frequency distribution spectral diagram illustrating a positional relationship between the signal spectrum of the high-frequency signal S1 and spin torque resonances obtained by including the parallel mixers 1(1, n) and the local signal generators 121 to 12n. To take a large number of frequency components from the signal spectrum of the high-frequency signal S1, distribution waveforms showing spin torque resonances of the mixers are arranged at equal frequency distances in a limitation bandwidth of the high-frequency signal S1 (with the frequency f1), and each of the distribution waveforms is caused to serve as a window function of a band-pass filter. It used to be difficult for a single mixer to adjust a pass-band width, but with the use of a plurality of parallel mixers, a pass-band width can be adjusted and a power characteristic can be made flat at a peak portion.

Figure 8:
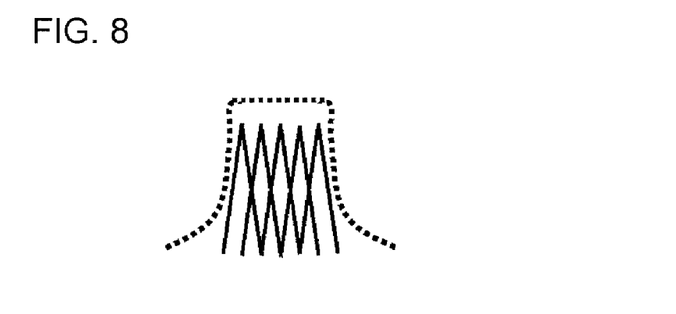
FIG. 8 is a spectral diagram illustrating band-pass filter characteristics when output signals (multiplication signals) S41 to S4n of the parallel mixers 1(1, n) are added together.

FIG. 8 is a spectral diagram illustrating filter characteristics in a case where output signals (multiplication signals) S41 to S4n of the parallel mixers 1(1, n) are added together. A magnetic field is appropriately applied to the free magnetic layer of the magnetoresistance effect device 2 at an angle of 5° to 175° from the film surface direction toward the direction normal to the film surface, thereby obtaining a spin torque resonance state with a high Q factor. The use of parallel mixers in a spin torque resonance state with a high Q factor can obtain a steep filter characteristic but pass-band widths of the mixers are narrow. However, superimposing, i.e., adding the outputs of the mixers can achieve a band-pass filter characteristic with a desired pass-band width. As illustrated in FIG. 8, in the obtained band-pass filter characteristic, the power characteristic at the peak portion is flat and the slopes at both shoulders are steep (i.e., the isolation difference between a pass signal level and a cutoff signal level is sufficiently large).

Figure 9:
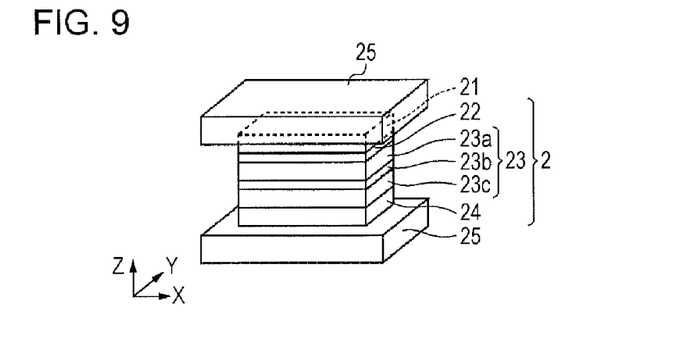
FIG. 9 is a perspective view illustrating a periphery of the magnetoresistance effect device 2 (a TMR device).

FIG. 9 illustrates a configuration of a TMR device including a free magnetic layer 21 and a fixed magnetic layer 23 that are magnetized in the in-plane direction relative to the magnetic layer surface. Specifically, the magnetoresistance effect device 2 includes the free magnetic layer 21, a spacer layer 22, the fixed magnetic layer 23, and an antiferromagnetic layer 24, which are stacked in this order between an upper electrode 25 and a lower electrode 26 with the free magnetic layer 21 being connected to the upper electrode 25 and the antiferromagnetic layer 24 being connected to the lower electrode 26. In this case, the free magnetic layer 21 is made of a ferromagnetic material and serves as a magnetosensitive layer. The spacer layer 22 is a nonmagnetic spacer layer, is made of an insulating nonmagnetic material, and serves as a tunneling barrier layer. The spacer layer 22 typically has a thickness of 1 nm or less. The lower electrode 26 is grounded. In the magnetoresistance effect device 2, examples of materials for the free magnetic layer 21 and the fixed magnetic layer 23 include magnetic metals such as Fe (iron), Co (cobalt), Ni (nickel), and Cr (chrome), magnetic alloys of the metals, and an alloy whose saturation magnetization has been reduced by mixing boron with a magnetic alloy.

As illustrated in FIG. 9, the fixed magnetic layer 23 includes, for example, a ferromagnetic layer (a second magnetic layer) 23a having a fixed magnetic orientation, a nonmagnetic layer 23b of a metal such as Ru, and another ferromagnetic layer (a first magnetic layer) 23c having a fixed magnetic orientation opposite to that of the ferromagnetic layer 23a. These layers are stacked in this order in such a manner that the ferromagnetic layer 23c is located on top of the antiferromagnetic layer 24. The stack configuration of the fixed magnetic layer 23 may employ, for example, a multilayer film of CoFe (ferrocobalt)-Ru (ruthenium)-CoFe (ferrocobalt).

In the magnetoresistance effect device 2, in order to facilitate large resonant motion of the free magnetic layer 21, the size of the free magnetic layer 21 is preferably smaller than a 200 nm square, and the device resistance is preferably set such that a DC resistance is close to 50 Ω for matching with a high-frequency transmission circuit. The tunneling barrier layer 22 is preferably made of single crystal MgOx (001) or polycrystalline MgOx (0<x<1) layer (hereinafter referred to as a "MgO layer") in which (001) crystal plane has a preferred orientation. In addition, it is preferable to dispose an interface layer (not shown) of ferrocobaltboron (CoFeB) between the tunneling barrier layer 22 and the free magnetic layer 21 having a body-centered cubic (BCC) lattice and an interface layer (not shown) of ferrocobaltboron (CoFeB) between the tunneling barrier layer 22 and the fixed magnetic layer 23 having a BCC lattice, because a coherent tunneling effect is expected to achieve and a high rate of change of magnetic resistance is obtained.

The foregoing configuration is not restrictive, and various configurations may be employed. For example, an example has been described in which a TMR device such as a MgO-TMR device is used as the magnetoresistance effect device 2 but, alternatively, other magnetoresistance effect devices such as a current-perpendicular-to-plane giant magnetoresistance (CPP-GMR) device may be used.

In the foregoing example, the frequency component (f1−f2) in a lower frequency range in desired frequency components (f1+f2 and f1−f2) included in the output signal S5 output from the impedance converter 5 through the mixing operation of the mixer 1,1(1, n) passes through the low pass filter or a band-pass filter. Alternatively, in the case of allowing a frequency component (f1+f2) in a higher frequency range to pass through the filter and be output as the multiplication signal S3, the filter 13 may be configured as a band-pass filter or a high pass filter. In the foregoing example, the impedance circuits 4, 41 to 4n include passive filters constituted only by passive device such as capacitors. Alternatively, the impedance circuits 4, 41 to 4n may include active filters using operational amplifiers.

In the foregoing example, the intensities of the magnetic fields H, H1 to Hn applied from the magnetic field applying units 3, 31 to 3n to the magnetoresistance effect devices 2, 21 to 2n are allowed to change. Alternatively, in a case where the frequency f2 of the local signals S2, S21 to S2n and the frequencies f21, f22, f23, . . . , and f2n near the frequency f2 are fixed, the intensities of the magnetic fields H and H1 to Hn generated by the magnetic field applying units 3, 31 to 3n may be fixed. Thus, in such a case, the intensities of the magnetic fields may be maintained constant using, for example, a permanent magnet. This configuration can simplify the magnetic field applying unit 3, thereby reducing fabrication cost.

In the above example, the frequency f2 of the local signal S2 and the frequencies f21, f22, f23, . . . , and f2n near the frequency f2 of S21 to S2n match the resonant frequency f0 of the magnetoresistance effect device 2 and the frequencies f01, f02, f03, . . . , and f0n near the frequency f0 of the magnetoresistance effect devices 21 to 2n. Alternatively, the frequency of the frequency f2 may be a frequency near the resonant frequency f0. The impedance circuits 4, 41 to 4n include passive filters constituted only by passive devices such as capacitors in the above example. Alternatively, a stub may be used to enhance selectivity of the filter.

REFERENCE SIGNS LIST 1, 1(1, n) mixer
2, 21 to 2n magnetoresistance effect device
3, 31 to 3n magnetic field applying unit
4, 41 to 4n impedance circuit
4a, 4a1 to 4an capacitor
5 impedance converter
5a operational amplifier
5A parallel input sections
6 resonance characteristics of magnetoresistance effect device
7, 71 to 7n band-pass filter
8, 81 to 8n mixer
11 RF amplifier
11A parallel output sections
12, 121 to 12n local signal generator
13 filter
21 free magnetic layer
22 spacer layer
23 fixed magnetic layer
100, 100(1, n) frequency converter
H, H1 to Hn magnetic field
$S_{RF}$ RF signal
S1 signal
S2 local signal
S3 multiplication signal
S4 multiplication signal from magnetoresistance effect device
S5 multiplication signal output from magnetoresistance effect device and subjected to power amplification by amplifier at subsequent stage

The invention claimed is:

1. A frequency converter comprising:
a plurality of mixers each including
a magnetoresistance effect device including a fixed magnetic layer, a free magnetic layer, and a nonmagnetic spacer layer sandwiched between the fixed magnetic layer and the free magnetic layer, when receiving a first high-frequency signal and a local second high-frequency signal, the magnetoresistance effect device multiplying the first high-frequency signal and the local second high-frequency signal by a magnetoresistance effect to generate a multiplication signal, and
a magnetic field applying unit that applies a magnetic field to the free magnetic layer, wherein
a plurality of multiplication signals generated when the first high-frequency signal and the local second high-frequency signals that differ from one mixer to another are input to the mixers, are added together and are output.

2. The frequency converter of claim 1, wherein
the local second high-frequency signals that differ from one mixer to another are set to have frequencies near a frequency f2 defined for a local signal.

3. The frequency converter of claim 2, wherein
the local second high-frequency signals that differ from one mixer to another are set such that, when the local second high-frequency signals are defined to each have a frequency of $f2+n\times\Delta f$ (where $\Delta f$ is an amount of change of f, n is ..., −2, −1, 0, 1, 2, ..., and $\Delta f$ is a frequency step size), the local second high-frequency signals are scattered at an identical frequency step size and all the differences between the frequencies of the local second high-frequency signals and the frequency f2 are added together so that $\Sigma(n\times\Delta f)$ of a sum of all the differences approach zero.

4. The frequency converter of claim 1, wherein
a resonant frequency of the magnetoresistance effect device included in each of the mixers is near the frequency f2 of the local second high-frequency signals.

5. The frequency converter of claim 4, wherein
the resonant frequencies of the magnetoresistance effect devices are set such that when each of the resonant frequencies is defined to be $f0+n\times\Delta f$ (where n is ..., −2, −1, 0, 1, 2, ..., and $\Delta f$ is a frequency step size), the resonant frequencies are scattered at an identical frequency step size, a frequency f0 matches the frequency f2 of the local second high-frequency signals, and all the differences between the resonant frequencies and the frequency f2 are added together so that $\Sigma(n\times\Delta f)$ of a sum of all the differences approach zero.

6. The frequency converter of claim 1, wherein
the first high-frequency signal is divided and input to the mixers.

7. The frequency converter of claim 6, wherein
for the division of the first high-frequency signal, a plurality of output buffers of RF semiconductor amplifiers are provided such that the first high-frequency signal does not return to the RF amplifiers from the magnetoresistance effect device.

8. The frequency converter of claim 1, wherein
when the first high-frequency signal is defined to have a frequency of f1 (f1>f2), all the multiplication signals (with frequencies $(f1+f2+n\times\Delta f)$ and $(f1-f2-n\times\Delta f)$) occurring in the mixers are added together so that $\Sigma(n\times\Delta f)$ of a sum of all the differences approach zero, (f1+f2), and (f1−f2).

\* \* \* \* \*